United States Patent [19]
Pryor

[11] Patent Number: 5,646,474
[45] Date of Patent: Jul. 8, 1997

[54] BORON NITRIDE COLD CATHODE

[75] Inventor: Roger W. Pryor, Bloomfield Hills, Mich.

[73] Assignee: Wayne State University, Detroit, Mich.

[21] Appl. No.: 411,249

[22] Filed: Mar. 27, 1995

[51] Int. Cl.$^6$ .................... H01J 19/24; H01J 1/05
[52] U.S. Cl. .................. 313/310; 313/309; 313/311; 313/336; 313/351
[58] Field of Search .................. 313/309, 310, 313/351, 336, 326, 311, 495, 496, 497

[56] References Cited

U.S. PATENT DOCUMENTS

| | | | |
|---|---|---|---|
| 3,612,941 | 10/1971 | Nablo et al. | 313/310 |
| 3,982,148 | 9/1976 | Kalpan et al. | 313/351 |
| 4,683,043 | 7/1987 | Melton et al. | 204/192.15 |
| 4,926,437 | 5/1990 | Ford | 327/87 |
| 5,144,380 | 9/1992 | Kimoto et al. | 357/22 |
| 5,164,810 | 11/1992 | Doll et al. | 257/76 |
| 5,180,951 | 1/1993 | Dworsky et al. | 315/169.3 |
| 5,227,318 | 7/1993 | Doll et al. | 437/31 |
| 5,330,611 | 7/1994 | Doll | 117/105 |
| 5,371,382 | 12/1994 | Venkatesan et al. | 257/77 |

OTHER PUBLICATIONS

"Epitaxial growth of diamond thin films on cubic boron nitride surfaces by dc plasma chemical vapor deposition" by S. Koizumi, T. Murakami and T. Inuzuka, 1990 American Institute of Physics, *Appl. Phys. Lett.*, 6 Aug. 1990.

*Primary Examiner*—Nimeshkumar Patel
*Attorney, Agent, or Firm*—Dykema Gossett PLLC

[57] ABSTRACT

A cold cathode is formed of n-type boron nitride. The cathode may include a layer of diamond underlying the boron nitride. The cathodes are made by laser ablation or by sputtering. Electronic devices utilizing the boron nitride cathodes are also described.

7 Claims, 2 Drawing Sheets

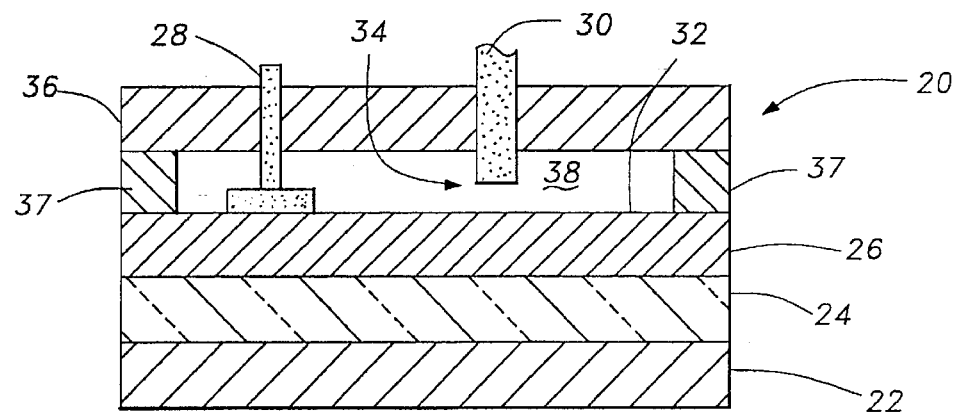
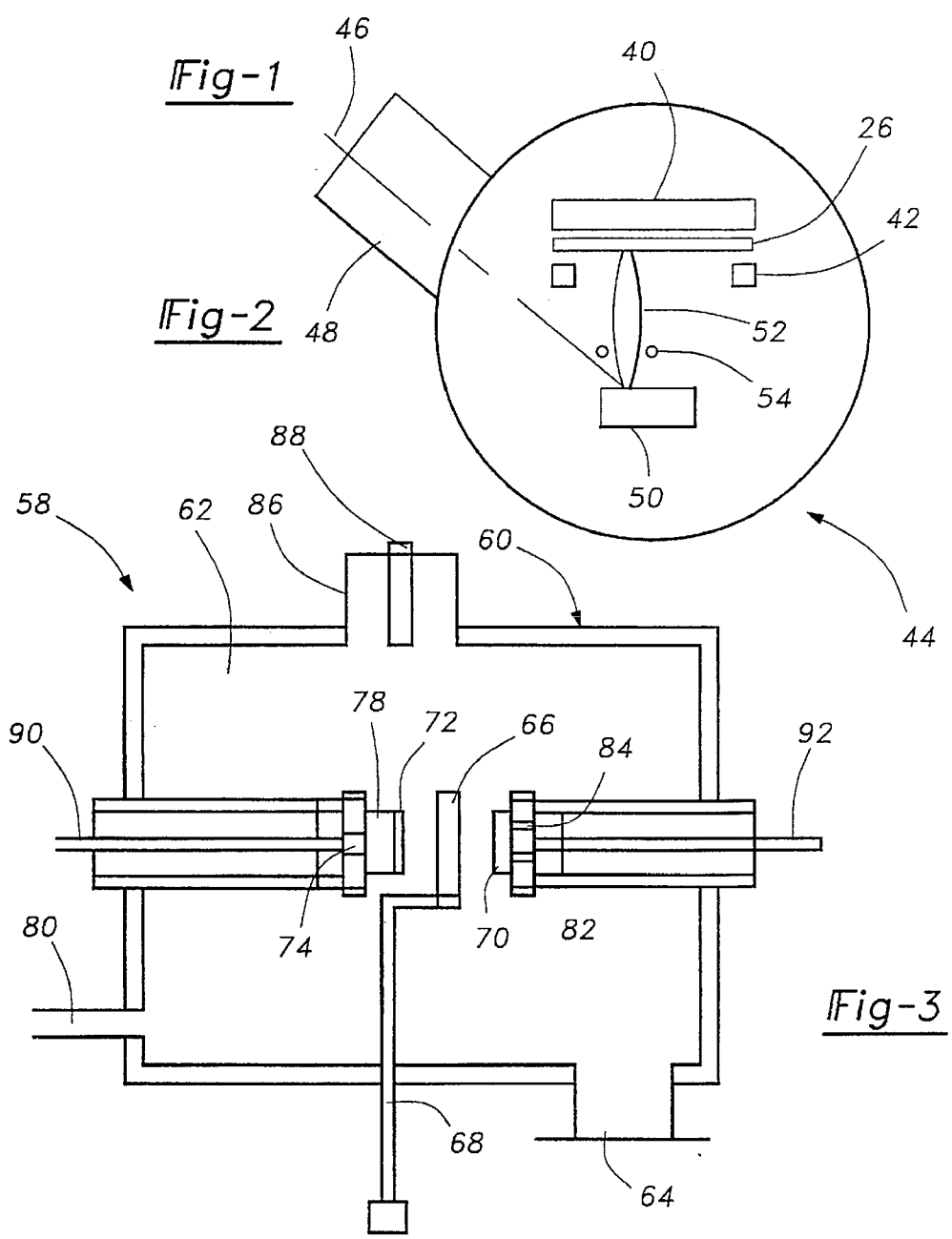
Fig-1
Fig-2
Fig-3

BORON NITRIDE COLD CATHODE

FIELD OF THE INVENTION

The present invention generally relates to electron emitter materials and more specifically provides a new class of electron emitter devices which are based on boron nitride.

BACKGROUND OF THE INVENTION

Boron nitride (BN) has become a very important industrial material in recent years due to a number of desirable properties. It can serve as a wide band gap semiconductor with high thermal conductivity and chemical inertness or as a thermal insulator. Boron nitride exists in several crystalline structures, including hexagonal and cubic. Boron nitride that has the cubic crystalline structure, commonly known as cubic boron nitride (or cBN), is of particular interest to the electronics industry. The structure of a boron nitride film may run from amorphous to polycrystalline to single crystal. A method for forming single crystal cBN is disclosed in Applicant's co-pending United States patent application Ser. No. 102,605, entitled, "AN IMPROVED METHOD OF FORMING CUBIC BORON NITRIDE FILMS," filed Aug. 5, 1993, the entire disclosure of which is incorporated herein by reference.

Cathodes are used in a number of electronic devices such as displays, power amplifiers and vacuum microelectronics. Conventional cathode structures are relatively low current devices which require either high extraction voltages or elevated temperatures for operation. Accordingly, it would be desirable to provide a cold cathode which would function at lower temperatures and voltages than existing cathodes.

Cubic boron nitride has been disclosed in the art as a material for use in microelectronics devices. For example, in U.S. Pat. No. 5,227,318, it is disclosed that p-type or n-type cBN can be used in the fabrication of bipolar transistors where the doped cBN forms the emitter and collector regions. Carbon doped cubic boron nitride films are disclosed in U.S. Pat. No. 5,330,561 wherein it is suggested that the films may be useful in high temperature electronics applications. Both p-type and n-type single crystal boron nitride is also disclosed in the afore-referenced U.S. Patent application Ser. No. 102,605. The use of diamond as a cold cathode is also known.

It is an object of the present invention to provide a cold cathode material which is capable of producing large currents at relatively low applied fields and at ambient temperature.

It is another object of the present invention to provide microelectronic devices having a cathode structure fabricated of boron nitride.

It is yet another object of the present invention to provide such cold cathode materials which can be fabricated by laser ablation, chemical vapor deposition or sputtering processes.

SUMMARY OF THE INVENTION

In accordance with the present invention, a cold cathode material is provided which comprises n-type boron nitride. The boron nitride cold cathodes of the invention may be amorphous boron nitride, polycrystalline boron nitride or single crystal boron nitride. The cold cathodes of the present invention may comprise mixed forms of the various phases of boron nitride. The boron nitride cold cathodes of the invention may be operated at temperatures as low as $-40°$ C. with extraction voltages of as low as 0.1 volts. They are capable of producing currents as high as 100 amperes.

In another aspect the present invention provides a new class of electronic devices in which the cathode material is n-type boron nitride. These devices include lamps, flat panel displays, power amplifiers, vacuum microelectronics, radiation hard computers and transient suppression devices and the like.

In still another aspect, the cold cathodes of the invention are composite structures of born nitride and diamond. A diamond layer is created by microwave or some other type of CVD which serves as a substrate on which a boron nitride layer is deposited. The boron nitride layer and the diamond layer are doped n-type.

In still another aspect the cold cathodes of the invention are free-standing structures of boron nitride.

In still another aspect the invention provides methods for fabricating boron nitride cold cathodes by laser ablation deposition utilizing a reactive biased laser ablation technique in which the surface of a silicon substrate is first pretreated with atomic hydrogen and then irradiated with a laser plume energized by at least one biased ring. A doped cubic boron nitride layer is then deposited under biased conditions in an argon/nitrogen, dopant/nitrogen/argon or dopant/nitrogen atmosphere.

In still another embodiment the boron nitride cold cathodes of the invention are formed using a reactive sputtering process. Sputtering is carried out by magnetron sputtering deposition using a hexagonal boron nitride target.

Other objects, features and advantages of the present invention will become apparent upon consideration of the specification and the appended drawings.

BRIEF DESCRIPTION OF THE DRAWINGS

FIG. 1 is a front elevational cross-section of microelectronic device made in accordance with the present invention.

FIG. 2 is a schematic view of a reactive, biased laser ablation deposition apparatus.

FIG. 3 is a schematic of a reactive magnetron sputter coating apparatus.

DETAILED DESCRIPTION OF THE PREFERRED EMBODIMENTS

Figure 4:
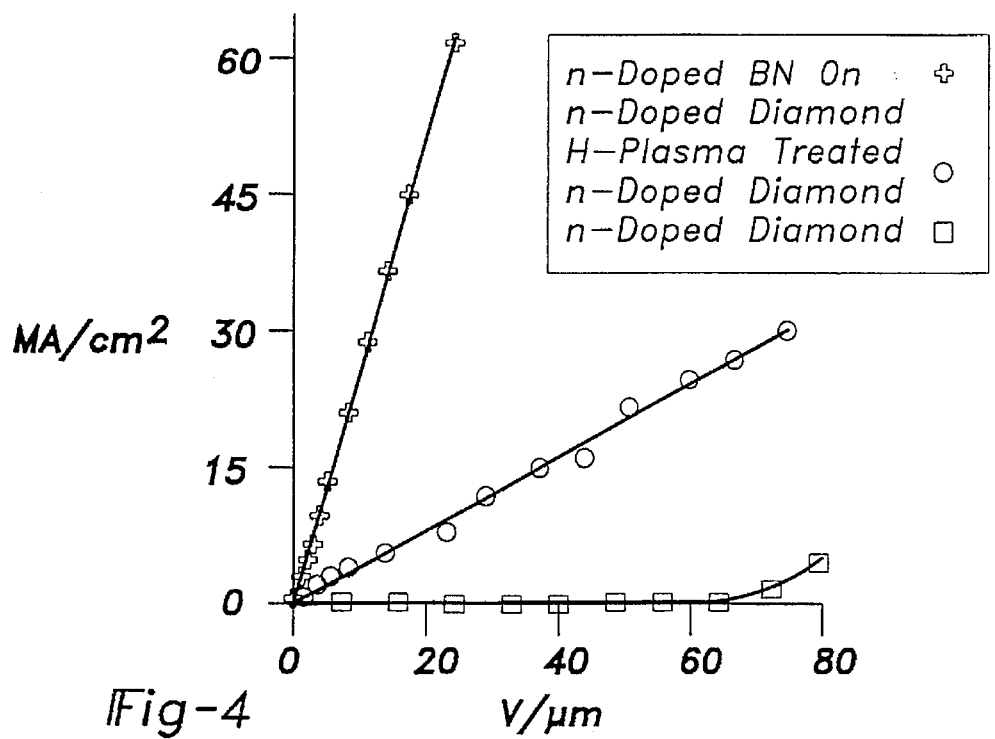
FIG. 4 is a graph comparing the electron emission of n-type boron nitride deposited on n-type diamond with H-plasma treated n-type diamond and non-H-plasma treated n-type diamond.

In the present invention boron nitride is used as a material to fabricate cold cathodes which are of particular use in microelectronic devices. The boron nitride cold cathodes of the present invention are capable of producing current under low extraction voltages at ambient temperatures. In one preferred embodiment the cold cathodes of the present invention produce up to 60 $mA/cm^2$ at a voltage of less than 20 volts when the cathode temperature is at $20°$ C. The ability to produce relatively high currents at modest voltages without the need to heat the cathode material makes the cathodes of the present invention highly desirable in microelectronic devices.

Referring now to FIG. 1 of the drawings, microelectronic device 20 is shown having a silicon substrate 22 on which an n-type diamond layer 24 is disposed. Overlying diamond layer 24, n-type boron nitride layer 26 is provided which functions as an electron emitter. Electrode 28 is in ohmic contact with boron nitride layer 26. Electrode 30 is spaced a predetermined distance from principal surface 32 to create gap 34. Electrodes 28 and 30 are preferably formed of tungsten; other metals such as nickel may be suitable. Dielectric layer 36 and dielectric spacers 37 are provided which may be glass or quartz or most other dielectric materials. A nylon material known as "Delrin" is also suitable. Electrodes 28 and 30 extend through layer 36. In this particular embodiment device 20 is a vacuum diode and, accordingly, the various layers create an hermetically sealed chamber 38. It is to be understood that the thin film fabrication techniques utilized to form device 20 will be understood by those skilled in the art based on the teachings herein and that it is the use of boron nitride to form the cold cathode structure which is novel. It is intended that numerous other microelectronic devices which utilize cathodes such as triodes, pentodes, magnetrons, flat panel displays and voltage regulators, photomultipliers and the like may be fabricated using n-type boron nitride as the cathode material based on the teachings of the present invention. Thus, the present invention in one aspect is directed to an entire class of electronic devices based on the discovery of n-type boron nitride as a cold cathode.

Referring again to FIG. 1 of the drawings, upon application of an appropriate voltage across electrodes 28 (negative polarity) and 30 (positive polarity), n-type boron nitride layer 26 emits electrons across gap 34 to electrode 30 to complete the circuit. It will be appreciated that diode 20 may be used in a number of applications such as current rectification or the like.

Silicon layer 22 is preferably doped n-type and functions as a support structure for the overlying layers in device 20 as well as during fabrication. It may be suitable to eliminate layer 22 in some applications. In device 20, layer 22 will typically be between from about 250 to about 750 microns thick or greater and will preferably be single crystal silicon doped with a suitable n-type dopant such as phosphorous or arsenic or antimony to a concentration of from about $10^{16}$ $cm^3$ to about $10^{21}$ $cm^3$.

Diamond layer 24 serves as an electrical conductor as well as a heat sink for device 20 and provides physical support for the overlying boron nitride layer 26. Diamond layer 24 is made synthetically through a deposition process, preferably CVD, by ionization of a carbon feed-stock gas. One suitable approach for fabricating diamond layer 24 is disclosed in Applicant's co-pending U.S. patent application Ser. No. 718,308, "Homoepitaxial Growth of Large Area Diamond Sheets," the entire disclosure of which is incorporated herein by reference. Therein, a method of depositing diamond on a silicon substrate is disclosed which uses microwave assisted CVD. Although that diamond layer 24 may be single crystal material, polycrystalline diamond may be used, particularly when it is desired to form a polycrystalline boron nitride layer. Diamond layer 24 is preferably from about 1 to about 200 microns thick and is doped n-type with a suitable dopant (as listed previously) to a concentration of from about $10^{16}$ $cm^3$ to $10^{22}$ $cm^3$. It is most preferred that the n-type dopant be added to the diamond material during the CVD process by including a phosphorus containing gas in the deposition chamber.

Boron nitride layer 26 is formed on diamond layer 24. Boron nitride layer 26 and diamond layer 24 do not need to be heteroepitaxial. Boron nitride layer 26 provides the numerous advantages of the present invention, i.e. high currents at low extraction voltages and ambient temperatures. Accordingly, although it is preferred that all three layers, boron nitride layer 26, diamond layer 24 and silicon support layer 22 be provided, it may be suitable in some applications to eliminate silicon layer 22, diamond layer 24, or both of these layers. It may also be suitable to use different support layers, or, in some applications, to eliminate all supporting layers, for example using an appropriate etchant or micro-machining technique to fabricate boron nitride as a free-standing cathode. Boron nitride layer 26 is preferably from about 0.001 to about 1500 microns thick and more preferably from about 0.1 to about 10 microns thick in device 20. The size of the boron nitride layer will be dictated in part by the particular application. Boron nitride layer 26 is doped n-type to a concentration of about $10^{16}$ $cm^3$ to about $10^{22}$ $cm^3$ and more preferably from about $10^{18}$ $cm^3$ to about $10^{20}$ $cm^3$. Suitable n-type dopants are carbon, lithium and sulfur. Carbon is a particularly preferred dopant for boron nitride layer 26. The preferred doping is in situ doping, i.e., the doping occurs as the layer is formed. Other dopant methods may be suitable.

Boron nitride layer 26 may be single crystal, amorphous or polycrystalline. It may be hexagonal or cubic or a combination of crystalline structures or alletropes and phases. Most preferred is polycrystalline boron nitride in which the individual crystallites are cubic boron nitride. It is preferred that the polycrystalline boron nitride of the present invention have an average grain size of from about 0.01 to about 10,000 microns and a range of grain sizes of from about 0.001 to about 10,000 and more preferably from 0.1 to 100 microns with a range of grain sizes of from 0.01 to 1000.

In one preferred embodiment, boron nitride layer 26 is transparent. This feature facilitates the use of boron nitride cold cathodes in such applications as photodetection. In general, boron nitride made following the method of reactive laser ablation deposition set forth below will be transparent. This property allows photons to pass through the n-type boron nitride cathode to stimulate electron emission from a layer underlying the boron nitride such as a doped silicon substrate. The electrons emitted from the substrate to the boron nitride layer stimulate the boron nitride to emit electrons as a cathode structure. Thus, by this method a photodetector device may be constructed.

One preferred method for forming boron nitride layer 26 is through the use of reactive laser ablation deposition. After preparation of the substrate layers and any necessary masking or the like, and referring now to FIG. 2 of the drawings, substrate 40 is placed in position for deposition of boron nitride layer 26. Laser deposition is preferably carried out after first creating an n-type diamond layer on a silicon substrate. The polycrystalline boron nitride layer 26 is formed in the presence of a nitrogen-containing atmosphere e.g., a nitrogen or nitrogen/argon atmosphere, preferably in the range between 0.1–100 millitorr, and more preferably in the range between 10–20 millitorr. By depositing the boron nitride at temperatures below about 600° C. and preferably between about 200 to 500, polycrystalline boron nitride forms. Ionized nitrogen formed during reactive laser ablation helps maintaining the stoichiometry of the boron nitride layer. An n-type dopant gas can also be included with the nitrogen or argon/nitrogen atmosphere, as explained more fully hereinafter.

The diamond substrate surface on which boron nitride layer 26 is deposited should be cleaned prior to the deposition process to remove possible contaminants. For the fabrication of polycrystalline boron nitride layer 26, diamond layer 24 is preferably polycrystalline diamond. A conventional cleaning technique such as an ethanol wash may be used. One preferred cleaning technique is a hydrogen plasma etching used directly in the laser ablation chamber to remove any residual contamination. This cleaning technique employs atomic hydrogen injectors 42 as shown in FIG. 2. By the in situ cleaning of a diamond surface in the laser ablation chamber, the possibility of contamination during thin film growth is minimized.

Reaction chamber 44 is provided into which a pulsed excimer laser beam 46 is introduced through a laser entry port 48. Upon entering reaction chamber 44, the excimer laser beam 46 which is focused with appropriate lenses (not shown) impinges upon the rotating ablation target 50. Target 50 is connected to a motor (not shown) whereby the target can be rotated. By adjusting the speed of rotation and the pulse rate of laser beam 46, the portion of target 50 that beam 46 strikes can be controlled. In one preferred embodiment, target 50 is a split target of hexagonal boron nitride and carbon to produce an n-type boron nitride layer.

As the pulsed excimer laser beam 46 impinges upon rotating target 50, a plume 52 of the target material is formed. One reason that the excimer laser is used in the present invention is that each photon possesses a large energy. For example, a KrF excimer laser produces 5.01 eV per photon at an oscillation wavelength of 248 nm. A $CO_2$ laser, on the other hand, only produces 0.12 eV per photon at an oscillation wavelength of 10.6 um. Another reason for utilizing a laser technique is that the laser beam can be converged with an optical system such as a focusing lens, thereby increasing the energy density. By applying a high energy laser beam on the target, a small area of the target is decomposed to generate excited species (or the "plume") to produce boron nitride film 26.

When laser beam 46 strikes the hexagonal boron nitride target 50, plume 50 which is generated consists of boron nitride related species and, in the case of a split target, the plume includes the desired dopant ions. Plume 50 then travels to the heated diamond/silicon substrate 40 and forms a deposit. The temperature of substrate 40 should be at least 200° C. and preferably at least 400° C. It is more preferred that the temperature of substrate 40 be in the range between 400° to 500° C. during deposition of polycrystalline boron nitride.

It is a preferred practice to use at least one bias ring 54 to further energize plume 52 during the boron nitride deposition process. It is also to be understood that other targets of boron nitride may be suitable or useful in a particular application.

As stated, in order to achieve the desired level of dopant in boron nitride layer 26, it is preferred that either a split or composite target of boron nitride and the dopant, for example carbon, be provided, or, alternatively, that a dopant gas, for example methane in the case of carbon doping, be utilized. A dopant source gas can be added to the nitrogen atmosphere at a volumetric ratio (carbon source gas-to-nitrogen) of from about 4-1 to about 10-1. Application of the dopant gas will generally be continuous with the deposition process. Other methods of doping may also be suitable.

Bias ring 54 supplies additional energy to the ablation plume 52 and thus more efficiently ionizes nitrogen gas and the ablated species. The increased energy of the plume also increases the surface mobility of the deposited material and thus provides for improved bonding between the boron nitride film and the substrate. The increased nitrogen ionization further reduces the nitrogen deficiency in the boron nitride layer.

Bias ring 54 is positioned between target 50 and substrate 40 such that plume 52 passes through the ring. When desired, more than one bias ring can be used. The ring is fabricated from a refractory material such as molybdenum, tungsten, or the like and is isolated from the ground by an insulator. The ring is charged to a desired electrical potential, e.g. a few hundred volts, such that it supplies additional energy to the ablation plume and more efficiently ionizes nitrogen gas at near the substrate surface.

The increased energy in the ablation plume also facilitates the mobility of the surface atoms in the deposition layer, forming high-quality cubic boron nitride if desired. The ionized nitrogen in the plasma helps to maintain the stoichiometry of the cubic boron nitride film since boron nitride from a hexagonal boron nitride target tends to become nitrogen deficient during laser ablation.

Following formation of n-type boron nitride layer 26, conventional techniques are utilized to form the additional structures, i.e. layer 36, spacers 37 and electrodes 28 and 30.

Another method of fabricating boron nitride cold cathodes which is provided in the present invention is through the use of sputtering. As will be appreciated by those skilled in the art, sputtering is a well known technique for forming films of materials and is described in the patent literature, for example U.S. Pat. Nos. 4,407,713 and 4,683,043, the entire disclosures of which are incorporated herein by reference.

More specifically, and referring now to FIG. 3 of the drawings, a sputtering apparatus 58 with casing 60 is shown which consists of a 9-liter aluminum vacuum chamber which may be used with multiple sputtering sources in a horizontal plane. Chamber 62 is evacuated with a vacuum pump which is attached to outlet 64. Base pressures in the range of $10^{-6}$ torr are maintained in chamber 62. A movable shutter 66, actuated for example by rotary device 68, is positioned between the boron nitride source 70, preferably hexagonal boron nitride, and the diamond/silicon substrate 72. Substrate 72 is held by substrate holder 74. Substrate 72 is positioned directly across from boron nitride source 70. Boron nitride source 70 is separated from substrate 72 by a suitable distance of from about 4 to 10 centimeters. Substrate heater 78 is positioned between substrate holder 74 and the substrate electrode.

In order to provide the necessary n-type dopant, a second sputtering source (not shown) may be used to supply the dopant. The second sputtering source may be positioned so that its orientation is perpendicular to the center line running from boron nitride source 70 to substrate 72.

Gases are admitted to the chamber through leak valve or port 80 and total gas pressure can be monitored with a manometer. Ultra-high purity (99.999%) gases (principally argon and nitrogen) are used to fill the chamber.

Both sputtering sources are operated in the magnetron mode. Rare-earth permanent magnets arranged as magnetic array 82 are held in support 84 and are placed behind the sputtering sources in a configuration which produces closed circular magnetic traps with field strengths of from about 500 to 1500 gauss. These magnetic traps increase the source emission rates and allow lower voltages to be applied to the sources. The dopant source is operated with a DC power supply and the boron nitride source is operated with a rf supply (2 kw at 13.56 MHz). The substrate may be rf biased, also using a 2 kw rf power supply operating at 13.56 MHz. Both rf power supplies should be in phase.

Substrate 72 is inserted into sample holder 74 and the holder is in turn inserted into the vacuum chamber through air lock 86 using substrate insertion rod 88. The sample holder is then locked into position in the rf-biased electrode 90. Another electrode 92 is provided for source 70. System base pressure is reduced to below about 5×10$^{-6}$ torr before the sputtering operation begins. Hydrogen is then admitted into the sputtering chamber to a predetermined level and the substrate is then plasma cleaned. Following cleaning, nitrogen/argon replaces the hydrogen to the desired level and the coating deposition is initiated by applying rf power to the water-cooled boron nitride source. The rf substrate electrode bias is maintained at between 0 and 1,000 volts during deposition. The dopant target (not shown) and boron nitride target or source 70 are typically started approximately simultaneously. Sputtering continues until an n-type boron nitride layer of the required thickness is created on substrate 72, which, as stated, in the preferred embodiment is n-type diamond on a silicon substrate. In order to achieve n-type doping of the boron nitride deposit, it is preferred that the dopant source comprise carbon.

Referring now to FIG. 4 of the drawings, the electron emission of n-type boron nitride cathode material made on n-doped diamond by laser ablation is shown in comparison with H-plasma-treated n-doped diamond and n-doped diamond without plasma treatment. The electron emission is significantly higher for the n-type boron nitride (doped to an apparent concentration of approximately $10^{19}$ cm$^3$ with carbon) than the other two materials.

Figure 5:
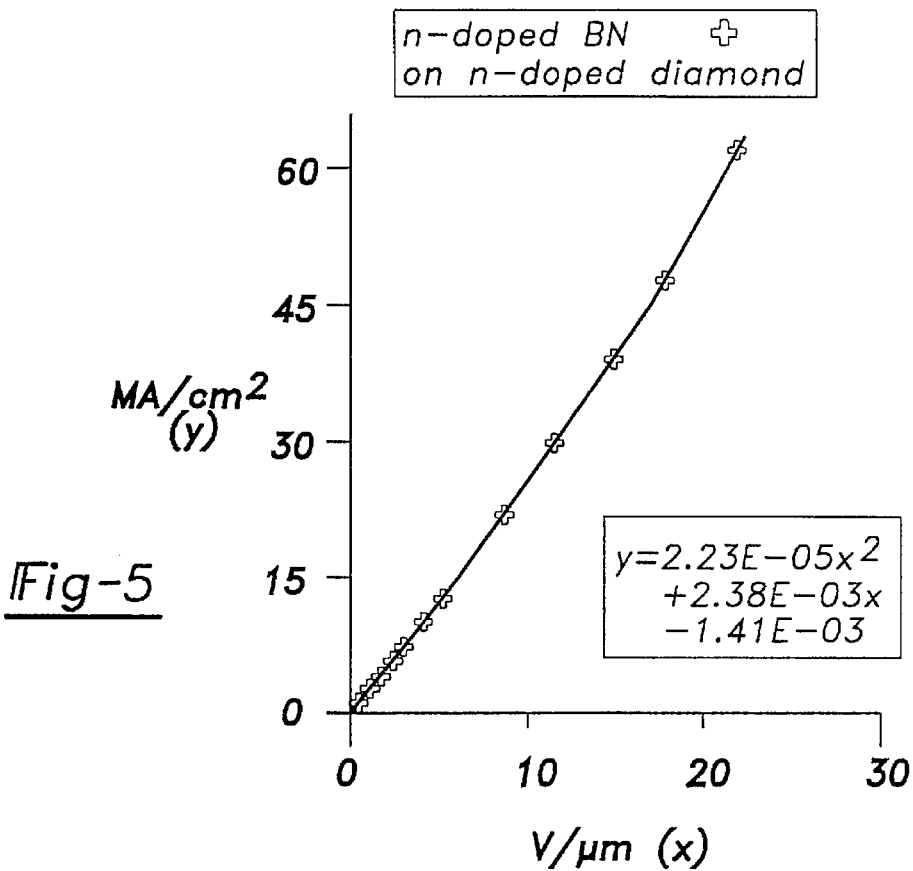
FIG. 5 is a graph illustrating the current ($mA/cm^2$) measured in a vacuum diode with a boron nitride cold cathode as a function of the applied field ($V/\mu M$) for n-type boron nitride films grown on n-type diamond on (100) Silicon.

In FIG. 5, the current (mA/cm$^2$) measured in a vacuum diode with n-type boron cold cathode is illustrated as a function of the applied field (v/μN) (n-type BN film grown on n-type diamond on (100)Si.

The following examples are provided to more clearly describe the invention and are in no manner to be deemed limiting on the full scope of the invention.

EXAMPLES

Example I

A suitably cleaned silicon substrate (i.e., a silicon wafer) is positioned inside the chamber of a laser ablation apparatus equipped with a rotating target that is partially or entirely comprised of hexagonal boron nitride (hBN). The substrate is heated to a temperature from 20° C. to 750° C. with the preferred temperature being 450° C. A pulsed excimer KrF laser beam operating at 248 nm with MgF$_2$ lenses is focused on the rotating target. Purified gas comprised of nitrogen, argon and methane are metered into the reaction chamber at about 15 mtorr during the ablation of the target. The ratio of the gases is determined by the desired properties of the final material. One preferred ratio is to have the target half carbon and half hBN (hexagonal boron nitride). In that case the gases are nitrogen and argon in the ratio of 1:4. If the target is all hBN, then the gas composition is methane and argon in the ratio of 4:1. The films resulting from this process can range from single crystal to amorphous, depending on the exact process conditions and substrate preparation. The best electron emitters appear to be those comprised of moderately sized crystals, 0.01 to 5 um.

Example II

A suitably cleaned n-doped polycrystalline diamond coated silicon substrate (i.e., a silicon wafer) was positioned inside the chamber of a laser ablation apparatus equipped with a rotating target that was half comprised of hexagonal boron nitride (hBN) and half comprised of carbon. The substrate was heated to a temperature of 450° C. A pulsed excimer KrF laser beam operating at 248 nm with MgF$_2$ lenses was focused on the rotating target. Purified gas comprised of nitrogen and argon was metered into the reaction chamber at about 15 mtorr during the ablation of the target. The ratio of the gases was determined by the desired properties of the final material. The gas composition was nitrogen and argon in a ratio of 1:4. The films resulting from this process were n-doped polycrystalline BN on n-doped diamond. This sample emitted 60 mA/cm$^2$ at an extraction field of less than 20 V/um. The current was only limited by the voltage limits of the power supply and the number of carriers injected into the conduction band of the BN by the pressure contact on the cathode side of the device. The current density/field curve showed a zero voltage crossover point, indicative of a true negative electron affinity emitter.

Example III

A suitably cleaned substrate (i.e., silicon, diamond coated silicon, molybdenum, tungsten, etc.) is positioned inside the chamber DC or RF magnetron sputtering apparatus equipped with a target that is partially or entirely comprised of hexagonal boron nitride (hBN). The substrate is heated to a temperature from 20 C to 750 C with the preferred temperature being 450 C. A few kilowatts of DG or RF power are applied to the magnetron target. Purified gas comprised of nitrogen, argon and methane are metered into the reaction chamber at about 15 mtorr during the sputtering of the target. The ratio of the gases is determined by the desired properties of the final material. One preferred ratio is to have the target mixed carbon and hBN, about 1:1. In that case the gases are nitrogen and argon in the ratio of 1:4. If the target is all hBN, then the gas composition is methane and argon in the ratio of 4:1. The films resulting from this process can range from single crystal to amorphous, depending on the exact process conditions and substrate preparation. The best electron emitters are believed to be those comprised of moderately sized crystals, 0.01 to 5 um.

What is claimed is:

1. A cathode-containing device in which a cathode emits electrons, comprising:
   a body defining a vacuum space;
   a cathode formed of boron nitride, said boron nitride being doped n-type; and
   an electrode associated with said boron nitride cathode, wherein a surface of said boron nitride cathode contacts said vacuum such that electrons are emitted from said boron nitride cathode into said vacuum space.

2. The cathode-containing device recited in claim 1, wherein said boron nitride is selected from the group consisting of amorphous boron nitride, polycrystalline boron nitride and single crystal boron nitride and combinations thereof.

3. The cathode-containing device recited in claim 2, wherein said boron nitride is polycrystalline boron nitride.

4. The cathode-containing device recited in claim 1, wherein said boron nitride is doped n-type with a dopant selected from the group consisting of carbon, lithium, and sulfur.

5. The cathode-containing device recited in claim 4, wherein said boron nitride is doped with an n-type dopant to a concentration of from about $10^{16}$ to about $10^{22}$ per cm$^3$.

6. The cathode-containing device recited in claim 1, wherein said boron nitride cathode includes a layer of boron nitride disposed on a layer of diamond.

7. The cathode-containing device recited in claim 6, wherein said diamond is n-type diamond.

* * * * *